United States Patent
Hsin et al.

(10) Patent No.: US 7,511,261 B2
(45) Date of Patent: *Mar. 31, 2009

(54) IMAGE SENSOR MODULE STRUCTURE WITH LENS HOLDER HAVING VERTICAL INNER AND OUTER SIDEWALLS

(76) Inventors: Chung Hsien Hsin, No.84, Taiho Road, Chupei, Hsinchu Hsien (TW); Tony Wang, No.84, Taiho Road, Chupei, Hsinchu Hsien (TW); Figo Hsieh, No.84, Taiho Road, Chupei, Hsinchu Hsien (TW); Chin Hai Chou, No.84, Taiho Road, Chupei, Hsinchu Hsien (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/923,908

(22) Filed: Aug. 21, 2004

(65) Prior Publication Data
US 2006/0011811 A1    Jan. 19, 2006

(30) Foreign Application Priority Data
Jul. 16, 2004    (TW) .............................. 93211284 U

(51) Int. Cl.
*H01L 23/00* (2006.01)
(52) U.S. Cl. .................... 250/239; 250/208.1; 250/216; 257/432; 257/433
(58) Field of Classification Search ............. 250/208.1, 250/214.1, 239, 214 R; 438/26, 27, 29, 64, 438/65, 69, 125, 126, 106, 116; 358/474, 358/482; 257/431–434, 678, 680
See application file for complete search history.

(56) References Cited

U.S. PATENT DOCUMENTS

| | | | | |
|---|---|---|---|---|
| 6,266,197 B1 * | 7/2001 | Glenn et al. | ................. | 359/819 |
| 6,483,030 B1 * | 11/2002 | Glenn et al. | ............... | 174/52.4 |
| 6,483,101 B1 * | 11/2002 | Webster | ..................... | 250/216 |
| 6,727,431 B2 * | 4/2004 | Hashimoto | .................. | 174/539 |
| 6,876,544 B2 * | 4/2005 | Hsin | ......................... | 361/679 |
| 6,946,316 B2 * | 9/2005 | Glenn et al. | .................. | 438/64 |
| 6,956,201 B2 * | 10/2005 | Webster | ..................... | 250/239 |
| 7,022,066 B2 * | 4/2006 | Yokoi et al. | ................. | 600/109 |
| 7,196,322 B1 * | 3/2007 | Hsin et al. | ................... | 250/239 |
| 2004/0179243 A1 * | 9/2004 | Hsieh et al. | ................. | 358/474 |
| 2004/0179249 A1 * | 9/2004 | Hsieh et al. | ................. | 358/505 |

\* cited by examiner

*Primary Examiner*—Thanh X Luu
*Assistant Examiner*—Tony Ko
(74) *Attorney, Agent, or Firm*—Pro-Techtor Int'l Services

(57) ABSTRACT

An image sensor module structure includes a substrate, a photosensitive chip, a lens holder, and a lens barrel. The substrate has an upper surface on which first electrodes are formed, and a lower surface on which second electrodes are formed. The chip is mounted on the upper surface, and is electrically connected to the first electrodes. The lens holder has an upper end face, a lower end face, and an opening penetrating through the lens holder. The upper end portion of the opening is formed with an internal thread, and the lower end portion of the opening is formed with a breach. The lens holder is adhered on the upper surface by glue. The photosensitive chip is located within the opening of the lens holder. The lens barrel has an upper end face, a lower end face, and an external thread screwed to the internal thread of the lens holder.

2 Claims, 1 Drawing Sheet

IMAGE SENSOR MODULE STRUCTURE WITH LENS HOLDER HAVING VERTICAL INNER AND OUTER SIDEWALLS

BACKGROUND OF THE INVENTION

1. Field of the Invention

The invention relates to an image sensor module structure, and in particular to an image sensor module, which may be manufactured to be light, thin, and small.

2. Description of the Related Art

Referring to FIG. 1, a conventional image sensor module includes a substrate 10, a photosensitive chip 20, a lens holder 24, and a lens barrel 32. The substrate 10 has an upper surface 12 on which first electrodes 16 are formed, and a lower surface 14 on which second electrodes 18 are formed. The photosensitive chip 20 is mounted on the upper surface 12 of the substrate 10, and is electrically connected to the first electrodes 16 of the substrate 10. The lens holder 24 has an upper end face 26, a lower end face 28, and an opening penetrating through the lens holder 24 from the upper end face 26 to the lower end face 28. The upper end of the opening is formed with an internal thread 30, the lens holder 24 is adhered to the upper surface 12 of the substrate 10 by glue. Thus, the photosensitive chip 20 is located within the opening of the lens holder 24. The lens barrel 32 has an upper end face 34, a lower end face 36, and an external thread 38 screwed to the internal thread 30 of the lens holder 24.

Accordingly, when the photosensitive chip 20 has a large scale, it is inconvenient, or even impossible to perform the manufacturing processes for bonding and electrically connecting wires to the first electrodes 16 of the substrate 10. Therefore, the size of the substrate 10 has to be enlarged to increase the space for wire bonding.

SUMMARY OF THE INVENTION

An objective of the invention is to provide an image sensor module structure, which may be easily packaged and has a reduced volume and a reduced manufacturing cost.

Another objective of the invention is to provide an image sensor module structure capable of packaging image sensor chips having different sizes without changing the package volume. The objective of producing packages having the same volume can be achieved.

To achieve the above-mentioned objects, the invention provides an image sensor module structure including a substrate, a photosensitive chip, a lens holder, and a lens barrel. The substrate has an upper surface on which first electrodes are formed, and a lower surface on which second electrodes are formed. The photosensitive chip is mounted on the upper surface of the substrate, and is electrically connected to the first electrodes of the substrate. The lens holder has an upper end face, a lower end face, and an opening penetrating through the lens holder. The upper end portion of the opening is formed with an internal thread, and the lower end portion of the opening is formed with a breach. The lens holder is adhered on the upper surface of the substrate by glue. Therefore, the photosensitive chip is located within the opening of the lens holder. The lens barrel has an upper end face, a lower end face, and an external thread screwed to the internal thread of the lens holder.

DETAILED DESCRIPTION OF THE INVENTION

Figure 1:
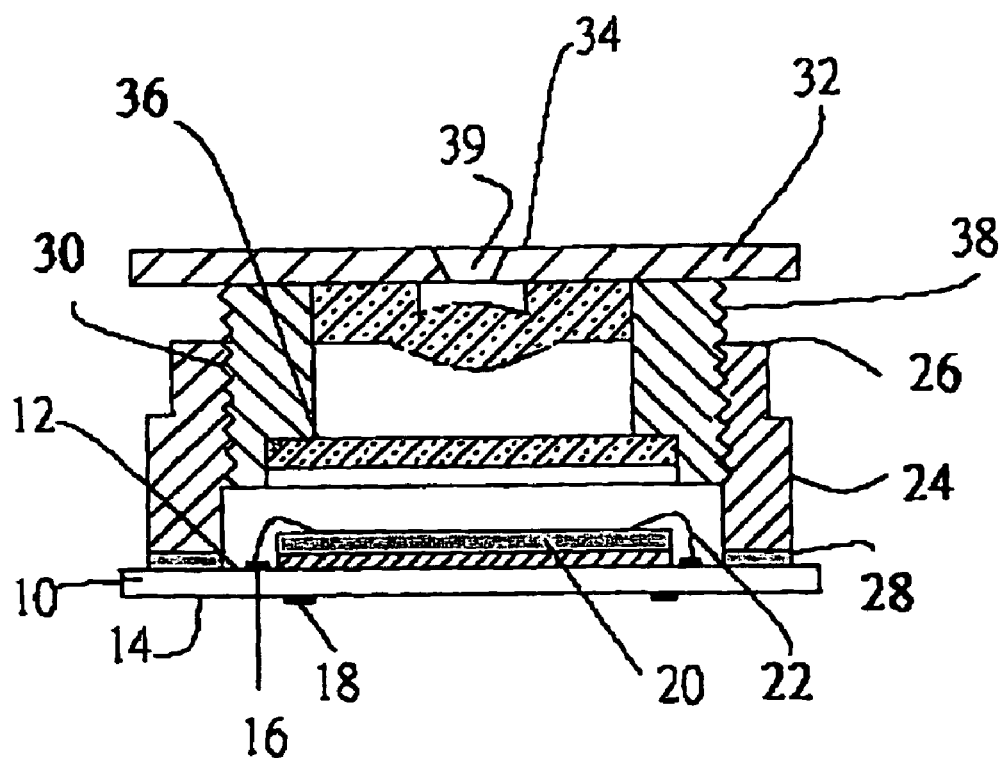
FIG. 1 is a cross-sectional view showing a conventional image sensor module structure.
Figure 2:
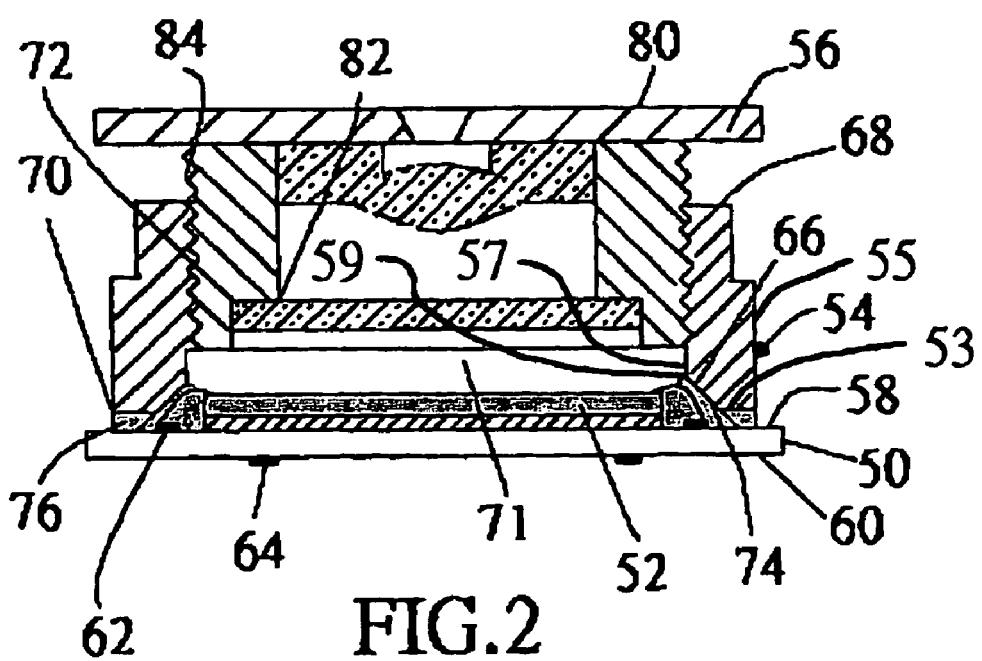
FIG. 2 is a cross-sectional view showing an image sensor module structure of the present invention.

Please refer to FIG. 2, an image sensor module structure of the present invention includes a substrate 50, a photosensitive chip 52, a lens holder 54, and a lens barrel 56.

The substrate 50 has an upper surface 58 on which first electrodes 62 are formed, and a lower surface 60 on which second electrodes 64 are formed. The first electrodes 62 are correspondingly and electrically connected to the second electrodes 64.

The photosensitive chip 52 is mounted on the horizontal upper surface 58 of the substrate 50, and is electrically connected to the first electrodes 62 of the substrate 50 by wires 66.

The lens holder 54 has an upper end face 68, a lower end face 70, and an opening 71 penetrating through the lens holder 54. The upper end portion of the opening 71 is formed with an internal thread 72, and the lower end portion of the opening 71 is formed with a breach 74. So, an internal diameter of the upper end portion of the opening 71 is smaller than an internal diameter of the lower end portion of the opening 71. In the embodiment, the breach 74 of the opening 71 has a triangular form. The lens holder 54 is adhered to the upper surface 58 of the substrate 50 by glue 76. The photosensitive chip 52 is located within the opening 71 of the lens holder 54. Then, the glue 76 is filled within the breach 74 of the lens holder 54 and is covered over the wires 66. In this embodiment, the lens holder 54 has a vertical inner sidewall 57 and a vertical outer sidewall 55. The vertical inner sidewall 57 is connected to the breach 74 at a portion 59, which is located at a level higher than a level of the photosensitive chip 52. A portion of each of the wires 66 is located under the breach 74. Also, an outer diameter of the lens holder 54 corresponding to the internal diameter of the upper end portion of the opening 71 is equal to an outer diameter of the lens holder 54 corresponding to the internal diameter of the lower end portion of the opening 71. The lens holder 54 further has a horizontal bottom surface 53 connected to the breach 74 and the vertical outer sidewall 55, and the horizontal bottom surface 53 is adhered to the horizontal upper surface 58 of the substrate 50 by the glue 76.

The lens barrel 56 has an upper end face 80, a lower end face 82, and an external thread 84 screwed to the internal thread 72 of the lens holder 54.

Therefore, it is possible to select the substrate 50 having a smaller size to package the photosensitive chip 52 having the same original size. Thus, it is possible to obtain an image sensor module structure having a smaller volume and to decrease the material costs for the substrate 50.

While the invention has been described by way of an example and in terms of a preferred embodiment, it is to be understood that the invention is not limited to the disclosed embodiment. On the contrary, it is intended to cover various modifications. Therefore, the scope of the appended claims should be accorded the broadest interpretation so as to encompass all such modifications.

What is claimed is:

1. An image sensor module structure, comprising:
  a substrate having a horizontal upper surface on which first electrodes are formed, and a lower surface on which second electrodes are formed, wherein the first electrodes are correspondingly and electrically connected to the second electrodes;

a photosensitive chip mounted on the upper surface of the substrate, and electrically connected to the first electrodes of the substrate by wires;

a lens holder having an upper end face, a lower end face, and an opening penetrating through the lens holder from the upper end face to the lower end face, wherein an upper end portion of the opening is formed with an internal thread and a lower end portion of the opening is formed with a breach so that an internal diameter of the upper end portion of the opening is smaller than an internal diameter of the lower end portion of the opening, the lens holder is adhered to the upper surface of the substrate by glue, the photosensitive chip is located within the opening of the lens holder, the glue is filled within the breach of the lens holder and coated over the wires, the lens holder has a vertical inner sidewall and a vertical outer sidewall, the vertical inner sidewall is connected to the breach at a portion, which is located at a level higher than a level of the photosensitive chip, a portion of each of the wires is located under the breach, and an outer diameter of the lens holder corresponding to the internal diameter of the upper end portion of the opening is substantially equal to an outer diameter of the lens holder corresponding to the internal diameter of the lower end portion of the opening; and a lens barrel having an upper end face, a lower end face, and an external thread screwed to the internal thread of the lens holder.

2. The image sensor module structure according to claim 1, wherein the lens holder further has a horizontal bottom surface connected to the breach and the vertical outer sidewall, and the horizontal bottom surface is adhered to the horizontal upper surface of the substrate by the glue.

* * * * *